United States Patent [19]

Shoji

[11] Patent Number: 4,514,749

[45] Date of Patent: Apr. 30, 1985

[54] VLSI CHIP WITH GROUND SHIELDING

[75] Inventor: Masakazu Shoji, Warren, N.J.

[73] Assignee: AT&T Bell Laboratories, Murray Hill, N.J.

[21] Appl. No.: 458,769

[22] Filed: Jan. 18, 1983

[51] Int. Cl.³ .............................................. H01L 23/48
[52] U.S. Cl. ...................................... 357/68; 357/40; 357/84; 357/80
[58] Field of Search ........................ 357/40, 68, 84, 80

[56] References Cited

FOREIGN PATENT DOCUMENTS

| 0007181 | 1/1978 | Japan | 357/40 |
| 0072457 | 6/1978 | Japan | 357/68 |
| 0087462 | 7/1980 | Japan | 357/84 |
| 0137666 | 10/1981 | Japan | 357/40 |

Primary Examiner—Andrew J. James
Assistant Examiner—William A. Mintel
Attorney, Agent, or Firm—Herbert M. Shapiro

[57] ABSTRACT

In VLSI chips, clock pulse skew is increasingly forbidding as one micron technology and operation at 25 megahertz is approached. Skew is avoided by encompassing the clock distribution line in such chips with ground lines to shield the distribution line from capacitive coupling to adjacent control lines. Skew is reduced dramatically.

4 Claims, 6 Drawing Figures

VLSI CHIP WITH GROUND SHIELDING

FIELD OF THE INVENTION

This invention relates to semiconductor integrated circuit (IC) chips and, more particularly, to the control of skew in timing pulses in such circuits.

BACKGROUND OF THE INVENTION

As line widths of complimentary metal-oxide-semiconductor (CMOS) very large scale integration (VLSI) chips decreases and operating frequency increases, capacitance loading causes increasingly large and unpredictable skew in clock pulses distributed in the chip. The uncertainty becomes unmanageable at about one micron feature size and 25 megahertz (MHz) operation because the capacitive coupling between adjacent wires becomes greater than that between a wire and the substrate at one micron and at 25 megahertz the skew is already noticeable and increasing linearly with frequency.

Although not generally recognized, adjacent electrical conductors in such VLSI chips exhibit widely varying and unpredictable capacitive loading characteristics. In a VLSI chip of 1 cm × 1 cm, a clock distribution line can be 1.5 cm long. The capacitance of the line is about 5 picofarads (pf) in 1.25 micron technology. This capacitance is larger than the drain and fanout capacitance (estimated at 1-2 pf). Consequently, the clock distribution delay is determined primarily by the uncertain clock line capacitance. If the clock circuit design delay specification in 2 nanoseconds (NS), the uncertainties in the clock edge are in the range of 1-5 NS which is unacceptable.

BRIEF DESCRIPTION OF THE INVENTION

Ground lines are located adjacent to selected portions of the wiring configuration of VLSI chips in a manner designed to reduce uncertainties in capacitive loading. In microprocessors where wiring patterns interconnect the control and data path portions, ground lines are added to encompass clock distribution lines. In some instances, existing ground and power BUSES can be located to either side of a clock distribution line in a manner to provide shielding. Although electrostatic shielding for reducing noise is well known, there was no recognition that uncertainties in capacitive loading were becoming important factors in VLSI chips in general and in microprocessors in particular as line widths decreased. Nor had it been suggested that shielding would be useful in reducing those uncertainties. Accordingly, the introduction of ground lines to encompass clock distribution lines to provide such shielding is considered a significant departure from prior art thinking.

DETAILED DESCRIPTION

Figure 1:
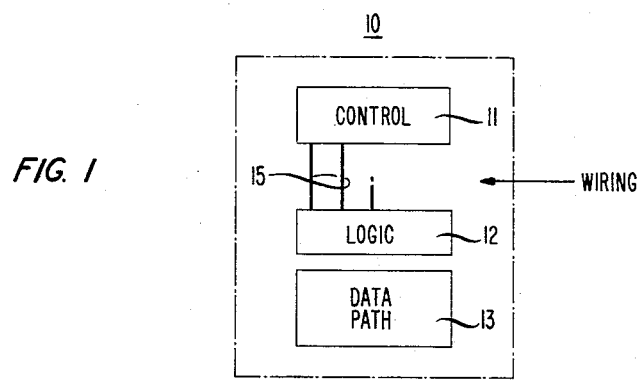
FIG. 1 is a schematic diagram of a microprocessor organization.

FIG. 1 shows a typical microprocessor defined by well known photolithographic techniques in a semiconductor chip 10. The microprocessor comprises control, logic and data path sections 11, 12 and 13, respectively. The control and logic sections are interconnected by a wiring pattern 15.

Figure 2:
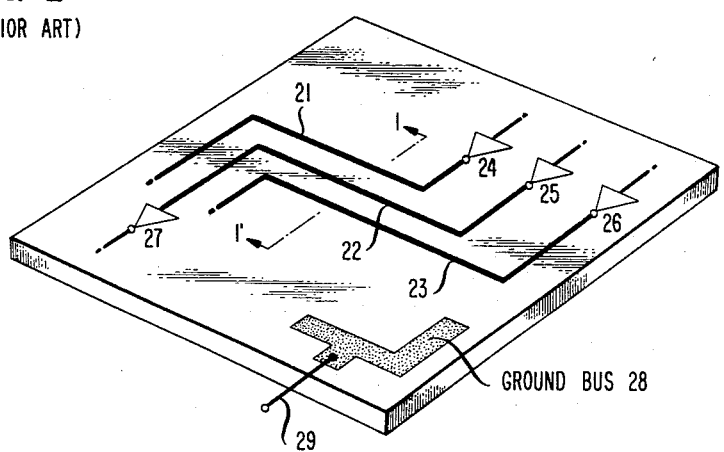
FIG. 2 is an enlarged plan view of a portion of the microprocessor of FIG. 1.

FIG. 2 shows, enlarged, a portion of the wiring pattern 15 of FIG. 1. The pattern includes three representative lines 21, 22 and 23. Inverters 24, 25, 26 and 27 are shown connected to the ends of the lines as representative of some logic circuitry, the specific nature of which is unimportant to an understanding of the invention. A separate ground BUS 28 is shown also. Ground BUS 28 would be connected to an external terminal on a chip carrier (not shown) by lead 29. Note that no electrical connection exists between BUS 28 and any of the lines of the wiring pattern.

Figure 3:
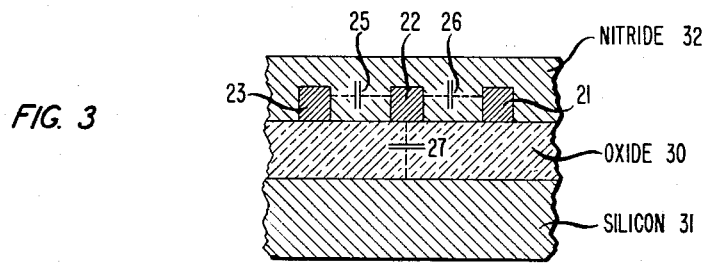
FIG. 3 is a cross-section of the portion of FIG. 2.

FIG. 3 shows a cross-section of the portion of the microprocessor shown in FIG. 2 taken along broken line 1—1+ of that Figure. Lines 21, 22 and 23 are of metal defined on oxide surface layer 30 on a silicon substrate layer 31 which is part of a chip. The metallic pattern is coated with a nitride layer 32 as is usual. We will assume that the dielectric constant $\epsilon$ for nitride is 7.5 and for oxide is 3.7. We also will assume that the cross-section of each of lines 21, 22 and 23 is square and the separation between the lines is about equal to the thickness of the oxide layer and a side of the square. The parasitic capacitances are represented by capacitors 35, 36 and 37. The worst case capacitance experienced by line 22 is:

$$C_{22W} = C_{37} + 4C_{36} \qquad (1)$$

where $C_{35}$ and $C_{36}$ are the capacitance of line 22 to line 21 and to 23, respectively. The worst case condition occurs when the center line 22 and lines 21 and 23 switch simultaneously but in the opposite polarity. The best case capacitance, on the other hand, is represented by:

$$C_{22B} = C_{37}. \qquad (2)$$

The best case occurs when all three conductors switch simultaneously in the same polarity. Then:

$$C_{22W}/C_{22B} = 5 \qquad (3)$$

is true for the case where $C_{35} = C_{36}$. Although the occurrence of such a large uncertainty in capacitance is unlikely, uncertainties on the order of 50 percent do occur and drastically affect circuit performance. In the case where line 22 is a clock distribution line, unpredictable skew occurs in the clock pulses. For VLSI chips with 1 micron technology, the clock skew will be determined entirely by the uncertain clock distribution line capacitance.

Figure 4:
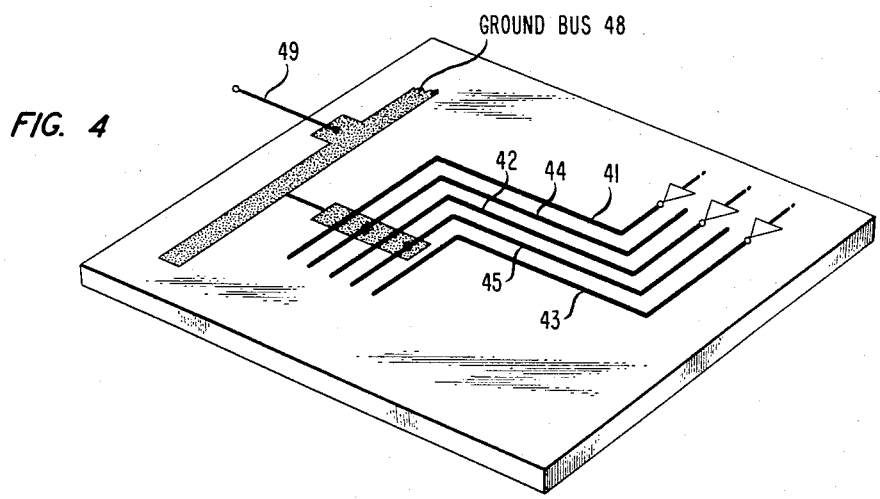
FIGS. 4, 5 and 6 are enlarged plan views of alternative wiring patterns for a portion of the microprocessor in accordance with the teachings of this invention.

FIG. 4 shows a portion of wiring section 15 of FIG. 1 including three lines 41, 42 and 43 corresponding to lines 21, 22 and 23 of FIG. 2, respectively. The Figure also shows two additional electrically conducting lines 44 and 45 located to either side of line 42 whose primary function is to provide electrostatic shielding of line 42 from either line 41 or 43, in accordance with the principles of this invention. The Figure also shows a ground BUS 48 corresponding to ground BUS 28 of FIG. 2 and suited to be wire bonded to an external electrode by wire 49. Lines 44 and 45 are connected directly to ground BUS 48, as shown, so as to be maintained essentially at ground.

Figure 5:
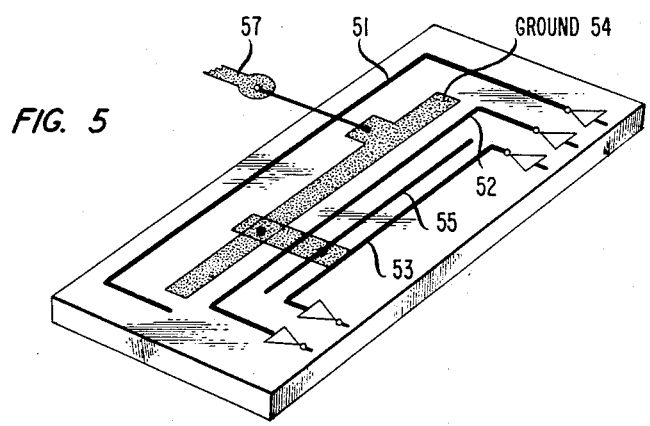

FIG. 5 shows another embodiment of this invention in which three lines 51, 52 and 53 correspond to lines 21, 22 and 23 of FIG. 2. The ground BUS 54 in this case is located between lines 51 and 52 and serves adequately as a shield therebetween. A shielding line 55, corresponding to line 45 of FIG. 4 is used to shield line 52 from line 53 and is connected to the ground BUS which, in turn, is connected by lead wire 56 to external terminal 57. It is clear from this embodiment that the ground BUS itself may be used to help encompass the clock distribution line 52 rather than using an additional ground line (like 44 of FIG. 4).

Figure 6:
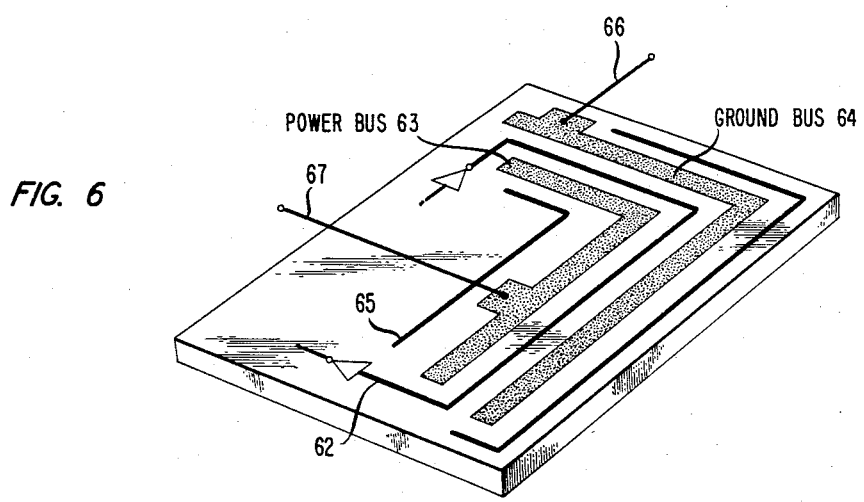

FIG. 6 shows an embodiment in which ground and power BUSES are used to encompass the clock distribution line obviating the need for additional ground lines like 44 and 45 of FIG. 4. Clock distribution line 62 is encompassed by power BUS 63 and ground BUS 64. Line 65 corresponds to line 41 of FIG. 4, while BUSES 63 and 64 correspond to lines 44 and 45 of FIG. 4, respectively. Power and ground BUSES 63 and 64 are connected to terminals via lead lines 66 and 67, respectively. It should be apparent from the embodiment of FIG. 6 that suitable shielding can be provided by changing locations of the clock distribution line and/or one or both of the power and ground BUSES without adding any additional ground lines.

It should be evident that the desired electrostatic shielding can be realized by enclosing the line to be protected by any pair of conductors, each of which is maintained at a fixed d-c potential, whether it be a ground bus, power bus or simple conductor maintained at an arbitrary d-c voltage.

How much of a clock distribution line needs to be shielded in this fashion will typically be a function of a number of factors. The present invention is of particular interest when a substantial portion of such line needs to be shielded.

Capacitive loading of the clock distribution line in any one of the embodiments of FIGS. 4, 5 or 6 is relatively low. Specifically, for one micron technology capacitive loading of 3 pf is achieved and a clock skew approaching zero is realized.

What is claimed is:

1. An integrated circuit chip having a wiring section including at least one clock distribution line and at least a first signal line, said wiring section including first and second lines adjacent to first and second sides of said clock distribution line, each of said first and second lines being adapted to be maintained at a fixed d-c potential for isolating said clock distribution line from said first signal line.

2. An integrated circuit chip in accordance with claim 1 wherein said first line comprises a ground BUS.

3. An integrated circuit chip in accordance with claim 2 wherein said second line comprises a power BUS.

4. An integrated circuit chip in accordance with claim 1 wherein the width of said clock distribution line is about equal to the spacings between said line and said first and second lines.

* * * * *